(12) United States Patent
Gall et al.

(10) Patent No.: US 6,927,344 B1
(45) Date of Patent: Aug. 9, 2005

(54) FLEXIBLE CIRCUIT BOARD ASSEMBLY

(75) Inventors: Thomas P. Gall, Northbrook, IL (US); Richard A. Hawkins, Palatine, IL (US); Kevin D. Moore, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 22 days.

(21) Appl. No.: 10/789,522

(22) Filed: Feb. 27, 2004

(51) Int. Cl.[7] ............................. H05K 1/00; B32B 3/28
(52) U.S. Cl. ..................... 174/254; 174/258; 174/261; 428/163
(58) Field of Search ................................ 174/254, 258; 428/209, 163

(56) References Cited

U.S. PATENT DOCUMENTS

| | | |
|---|---|---|
| 4,404,059 A | 9/1983 | Livshits et al. |
| 5,103,375 A | 4/1992 | Cottingham et al. |
| 5,159,751 A | 11/1992 | Cottingham et al. |
| 5,170,326 A | 12/1992 | Meny et al. |
| 5,179,501 A | 1/1993 | Ocken et al. |
| 5,216,581 A | 6/1993 | Fisher et al. |
| 5,265,322 A | 11/1993 | Fisher et al. |
| 5,276,418 A | 1/1994 | Klosowiak et al. |
| 5,386,341 A | 1/1995 | Olson et al. |
| 5,416,278 A | 5/1995 | Ostrem et al. |
| 5,434,362 A | 7/1995 | Klosowiak et al. |
| 5,754,409 A | 5/1998 | Smith |
| 5,925,298 A * | 7/1999 | Walles et al. ............... 264/139 |
| 5,998,738 A | 12/1999 | Li et al. |
| 6,099,745 A | 8/2000 | McKenney et al. |
| 6,256,203 B1 | 7/2001 | Ingraham et al. |
| 6,292,370 B1 | 9/2001 | Anderson et al. |
| 6,320,128 B1 | 11/2001 | Glovatsky et al. |
| 6,483,037 B1 | 11/2002 | Moore et al. |
| 6,483,713 B2 | 11/2002 | Samant et al. |
| 6,501,661 B1 | 12/2002 | Moore et al. |
| 6,528,736 B1 | 3/2003 | Dailey et al. |
| 6,711,024 B1 * | 3/2004 | Johansson et al. ........... 361/760 |

FOREIGN PATENT DOCUMENTS

| | | |
|---|---|---|
| WO | WO 03/036664 A1 | 5/2003 |
| WO | WO 01/80375 A1 | 10/2004 |

* cited by examiner

*Primary Examiner*—Cathy F. Lam
(74) *Attorney, Agent, or Firm*—Brian M. Mancini

(57) ABSTRACT

A flexible circuit board assembly and method includes a rigid circuit board having a first portion and a second portion separated by a bending region. A plurality of grooves are cut into the bending region. The grooves are cut substantially parallel to an axis about which the bending region is bent. Preferably, the grooves are located on an inside bending radius of the circuit board, but can be located on the outside radius or both.

17 Claims, 4 Drawing Sheets

FLEXIBLE CIRCUIT BOARD ASSEMBLY

FIELD OF THE INVENTION

The present invention relates generally to printed circuit boards, and, in particular, to the use of rigid circuit boards in a flexible assembly.

BACKGROUND OF THE INVENTION

Control units for automotive engines are disposed in a confined space in an environment subject to high ambient temperatures and extreme vibrations. Typically, in order to enhance thermal performance and protection against engine vibrations, a printed circuit board that includes control circuitry is affixed to a rigidizer that may be bent to produce a reduced size module and to also dissipate heat. For example, in an application using a printed circuit board that has a bent flexible circuit, as is used for packaging an electronic control unit, the printed circuit board is mounted to an aluminum rigidizer. The rigidizer provides mechanical support for the printed circuit board and assists in the dissipation of heat generated by components on the printed circuit board by conductively transferring the heat from the components to the underlying rigidizer.

Referring now to FIGS. 1 and 2, an electronic control unit (ECU) 100 of the prior art is illustrated. FIG. 1 is an isometric perspective of an end view of electronic control unit 100. FIG. 2 is a cross-sectional side view of electronic control unit 100. Electronic control unit 100 includes a flexible printed circuit board 104 that is affixed to a rigidizer 106 by use of an adhesive 202. Typically, circuit board 104 has a number of electronic components 102 mounted on the surface thereof. Adhesive 202 is disposed between rigidizer 106 and printed circuit board 104 and functions to secure the printed circuit board to the rigidizer. After being secured to the flat rigidizer, the rigidizer and printed circuit board assembly is folded, resulting in a folded printed circuit board consisting of two main portions 204, 208 at an angle to each other and connected by a bent section 206 captured within a recess 112 of the bendable region 116 of the rigidizer 106. To provide a bend in the circuit board, a flexible circuit board is used. Unfortunately, flexible circuit boards cost more than their rigid counterparts. For example, a flexible fiberglass-weave epoxy (FR4) circuit board costs more than a rigid FR4 circuit board. Basically, the price differential is due to the problems that manufacturers have in handling the flexible boards through panel plating and solder mask operations, resulting in lower yields and subsequently higher costs.

In addition, flexible circuit boards have become more complex. As the functionality of electronic control units has increased over time, the corresponding circuitry has become increasingly dense and complex. As a result, electronic control units have been migrating from the use of two-layer printed circuit boards, such as printed circuit board 104, to the use of four-layer printed circuit boards. One result of the manufacturing process of four-layer printed circuit boards is a thicker flexible circuit, even when the bend section remains a two-layer circuit. Due to their thickness, flexible circuit boards are now known to crack and split when bent, unless a large bend radius is achieved, resulting a control module that must be discarded. The discarded control modules result in excessive manufacturing costs and waste, especially since the printed circuit boards must be populated with components before being folded.

One solution has been to provide fewer layers in the circuit board at the bend section than in the flat sections. Another solution has been to heat the circuit board during bending. Both of these solutions require additional unusual processing steps in either the manufacturing of the circuit board or the assembly of the electronic control unit.

Therefore, a need exists for a method and apparatus to provide the benefits of rigid circuit boards in a flexible printed circuit board assembly.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, wherein:

DETAILED DESCRIPTION OF THE PREFERRED EMBODIMENT

Figure 1:
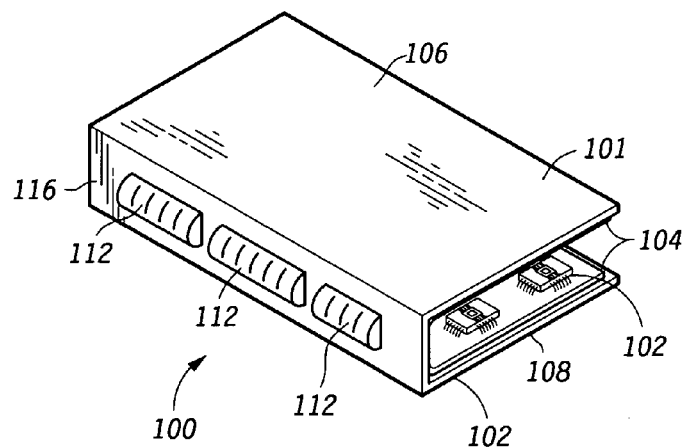
FIG. 1 is an isometric perspective of an end view of an electronic control unit of the prior art.
Figure 2:
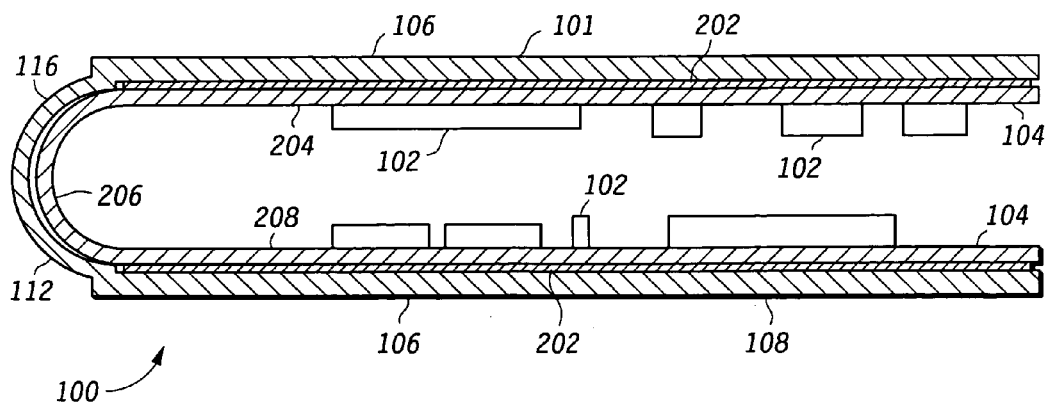
FIG. 2 is a cross-sectional side view of the electronic control unit of FIG. 1.

The present invention provides a method and apparatus for a rigid circuit board to be used in a flexible printed circuit board assembly. The electronic control unit (ECU) includes a rigid circuit board having a first portion interconnected to a second portion through a bendable region configured to be flexible. The electronic control unit further includes a substantially rigid substrate (e.g. aluminum) or rigidizer that having a first portion interconnected to a second portion through a bend region with a recess. The respective first and second portion of the rigidizer and circuit board are bonded together as a flat assembly. When the ECU is then folded, the bending region of the circuit board assumes a bend. The use of a specially configured rigid board results in a cost savings over the use of the flexible circuit board of the prior art. In various embodiments of the present invention, the bend in the bending region of the circuit board is facilitated by an aperture or recess in the bend region of the rigidizer.

Generally, one embodiment of the present invention encompasses an electronic control unit assembly system that includes a substantially rigid substrate or rigidizer having a first portion and a second portion separated by a bend region. The rigid substrate has an inside surface and an outside surface. The electronic control unit further includes a rigid circuit board having a first portion and a second portion separated by a bending region configured with grooves running parallel to the bend axis of the bending region. The bend region of the substrate includes a recess extending outwardly from the inside surface of the substrate with the recess sized to accept the bending region of the circuit board. The first and second portions of the circuit board are affixed to the respective first and second portions of the substrate in a substantially flat configuration, such as through the use of an adhesive. The electronic control unit is folded at an angle of between zero and one-hundred-eighty degrees such that the inside surface of the rigidizer defines an interior region of the electronic control unit containing the circuit board. When folded, the bending region of circuit board attains a shape with a large radius bend as a result of the folding by extending the interior region of the rigidizer into the recess formed in the bend region of the substrate.

Another embodiment of the present invention encompasses a method for forming a circuit board in an electronic control unit assembly that includes providing a rigid circuit board having a first portion and a second portion separated by a bending region and a substantially rigid substrate or rigidizer having a first portion and a second portion separated by a bend region. The method includes a step of forming a series of grooves in the bending region of the circuit board to make it flexible therewithin. An additional step includes forming a recess in the bend region of the substrate extending outwardly from an inside surface thereof with the recess sized to accept the bending region of the circuit board. The method includes an additional step of affixing the first and second portions of the circuit board to the respective first and second portions of the substrate. This can include a substeps of applying an adhesive to the inside surface of the flat rigidizer and mounting the flexible circuit board flat on the surface of the rigidizer via the adhesive. The method further includes a step of bending the rigid substrate in the bend region between the first portion and the second portion such that the bending region of the circuit board deforms into the recess of the substrate.

Figure 3:
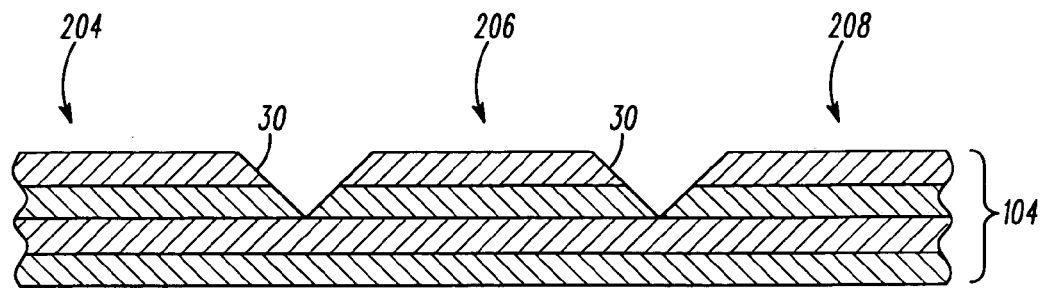
FIG. 3 is a cross-sectional side view of the flexible circuit board in accordance with a first embodiment of the present invention.
Figure 4:
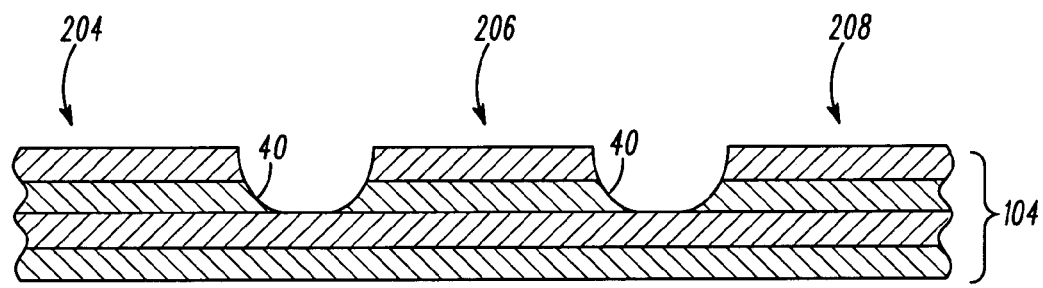
FIG. 4 is a cross-sectional side view of the flexible circuit board in accordance with a second embodiment of the present invention.
Figure 5:
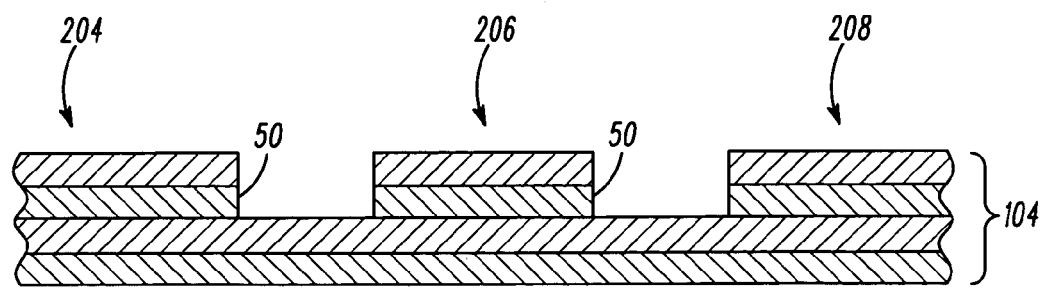
FIG. 5 is a cross-sectional side view of the flexible circuit board in accordance with a third embodiment of the present invention.

Referring now to FIGS. 3–5, various embodiments of the circuit board for assembly in the electronic control unit 100 are illustrated. In these embodiments, a four-layer circuit board is shown. However, the present invention is applicable to any number of layers. FIG. 3 is a cross-sectional side view of the circuit board 104, in accordance with a first embodiment of the present invention, using a series of V-notched grooves 30 machined or scored into the bending region 206 of the rigid circuit board. FIG. 4 is a cross-sectional side view of the circuit board 104, in accordance with a second embodiment of the present invention, using a series of U-notched grooves 40 machined or scored into the bending region 206 of the rigid circuit board. FIG. 5 is a cross-sectional side view of the circuit board 104, in accordance with a third embodiment of the present invention, using a series of substantially rectangular-notched grooves 50 machined or scored into the bending region 206 of the rigid circuit board. Although the grooves are shown extending halfway down (two layers) through a four layer circuit board, varying depths can be used. In addition, varying cross-sectional shapes can also be used equally well. The embodiments shown represent the most common shapes due to their ease of machining.

Figure 8:
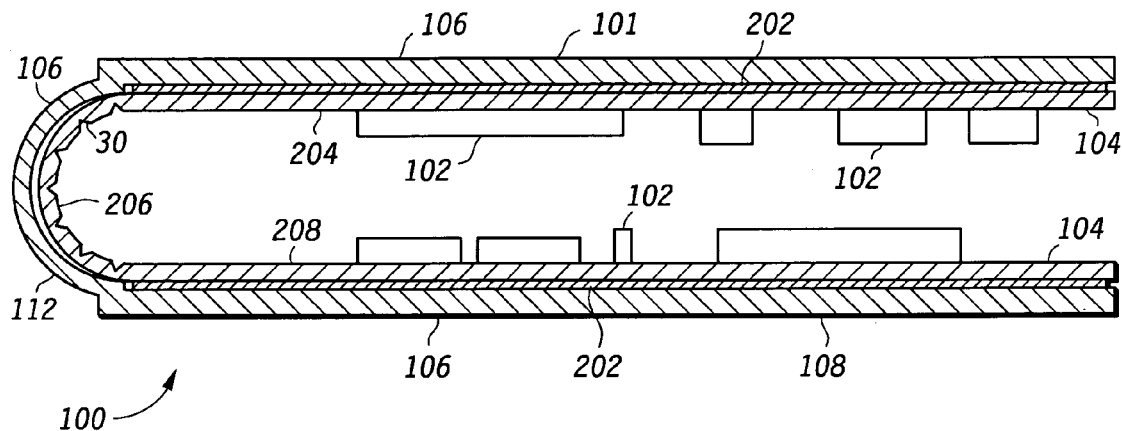
FIG. 8 is a cross-sectional side view of the electronic control unit with flexible circuit board assembly of FIG. 3.

Referring to FIG. 8, control unit 100 includes at least one electronic component 102, a circuit board 104, and a substantially rigid substrate (rigidizer) 106. Electronic component 102 represents any electronic components or devices that can be mounted to a printed circuit board such as, for example, a battery, a capacitor, a resistor, a semiconductor chip, a diode, an inductor, and a coil. Electronic component 102 is mounted onto a surface of circuit board 104. This can be accomplished by solder reflowing the parts to the flat circuit board before or during the assembly of the circuit board onto the rigidizer 106. Typically, circuit board 104 has a number of electronic components 102 mounted on the surface of the circuit substrate. These electronic components 102 are electrically connected to each other through a number of conductive pads or lands (not shown), conductive traces (not shown), and conductive vias (not shown) disposed on the surface and on or through internal layers of circuit board 104.

Circuit board 104 is a printed circuit board manufactured from any one of a number of materials known to one of ordinary skill in the art, such as epoxy glass, FR4, Resin Coated Copper, and polyimide. Preferably, the circuit board is made from rigid FR4 material in multiple layers. Preferably four or more layers of FR4 material are provided and up to five layers of circuitry. Of course, in the bending region, circuitry can not extend over the grooves, so circuitry is limited to those layers of the circuit board that are undisturbed by the grooving process.

Circuit board 104 is secured to an inner surface of the rigidizer 106. Circuit board 104 is secured to the inner surface by an adhesive 202, which is preferably a pressure sensitive adhesive (PSA) tape or film. In another embodiment of the present invention, the adhesive 202 may be a heat curable, liquid adhesive that is screen printed on the rigidizer 106. Those who are of ordinary skill in the art realize that there are many techniques for securing a circuit board 104 to a surface, such as mechanical fasteners such as screws or other adhesive laminates that may be placed on the surface, that may be used herein without departing from the scope of the present invention.

After assembly, the rigidizer 106 surrounds the circuit board 104 and is designed to shield the circuit board 104 and electronic components 102 from electrical charges that can damage the circuit board and electronic components. The rigidizer 106 also provides mechanical support and conductively dissipates heat for the circuit board 104. Preferably, the rigidizer 106 is manufactured from materials that are rigid enough to provide a rigid mechanical support for the circuit board 104, that is, to function as a rigidizer or stabilizer, and that have elements designed to shield the electronic components from heat, water, chemicals, and electrostatic charge, such as aluminum, copper, steel, engineering grade plastic, magnesium, and zinc or any material that is resistant to chemicals and elements commonly found in an automobile. Preferably rigidizer 106 is further manufactured from thermally conductive materials that transfer heat from the components 102 during operation of electronic control unit 100, thereby assisting the components in dissipating the heat. However, those who are of ordinary skill in the art realize that electronic control unit 100 may be used in low power operations where thermal issues, and the thermal conductivity of rigidizer 106, may be of minor importance.

Circuit board 104 and rigidizer 106 are bent or folded into an approximate 'U' shape. However, any angle of greater than zero and less than one-hundred-eighty degrees can be used in the present invention. The circuit board and rigidizer may be bent using any technique known to one of ordinary skill in the art. The rigidizer can be bent at two junctions along a major axis across the rigidizer between the first and second portions of the rigidizer and the bendable region. Preferably, the rigidizer is bent at ninety-degrees at both junctions to form a 'U' shaped assembly such that the bend region is substantially perpendicular to the first and second portions of the substrate, which are then substantially parallel with each other.

Figure 6:
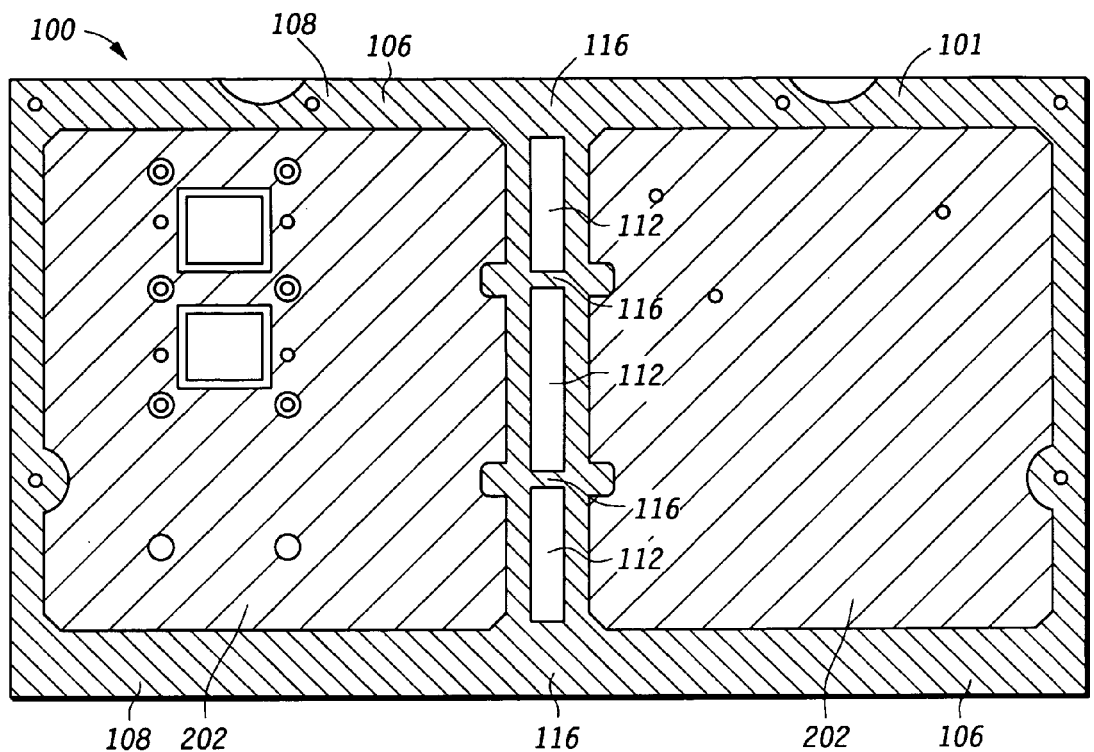
FIG. 6 is a top view of the rigidizer of FIG. 3, prior to being bent, with an adhesive applied to the rigidizer in accordance with an embodiment of the present invention.

FIG. 6 is a top view of the rigidizer 106 prior to being bent and with adhesive 202 applied to the inner surface of the rigidizer 106. As depicted, the second portion 108 of the rigidizer 106 is interconnected to first portion 101 by the bridges 116 included in the bendable region. FIG. 6 further illustrates the recesses 112 of the bendable region. The bridges 116 and recesses 112 facilitate a 'U'-shaped fold in circuit board 104 when the substrate and rigidizer are bent.

Figure 7:
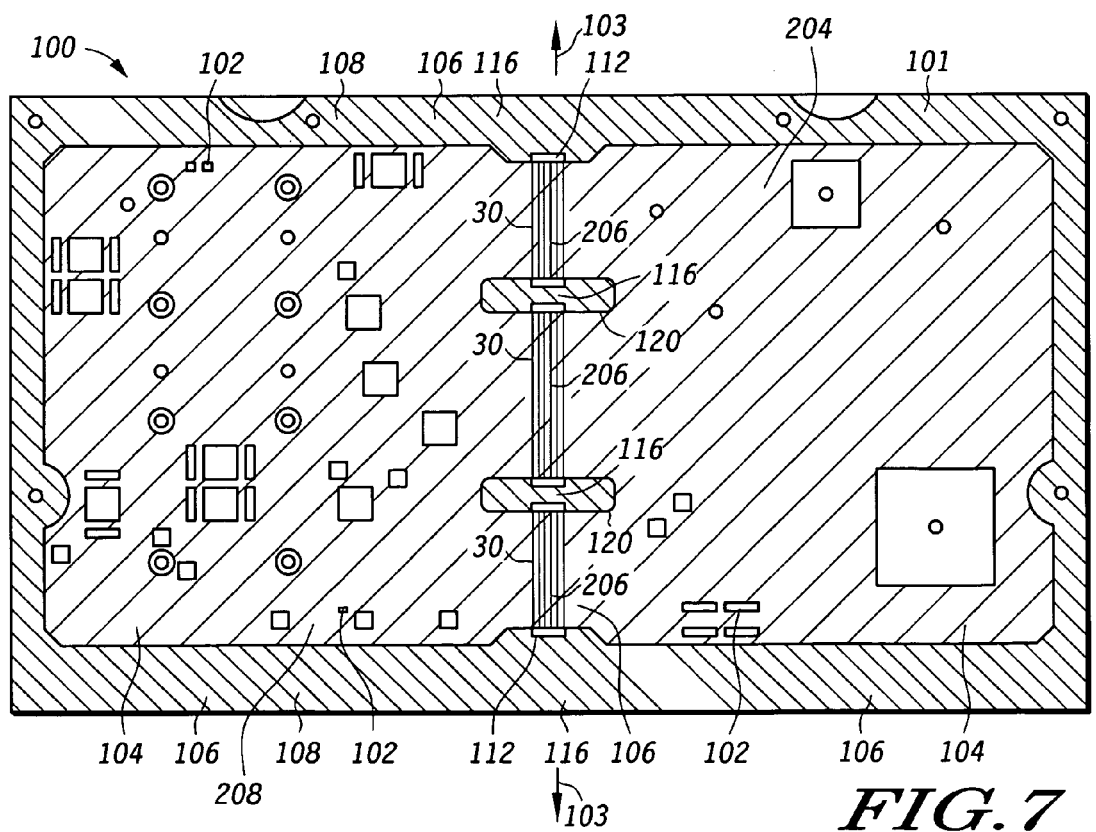
FIG. 7 is a top view of the electronic control unit of FIG. 3 prior to being bent and after a circuit board is mounted on the rigidizer and solder paste has been screened onto the circuit board in accordance with an embodiment of the present invention.

FIG. 7 is a top view of electronic control unit 100 after circuit board 104 is mounted flat on adhesive 102, and thereby on rigidizer 106, and after solder paste has been screened onto the substrate and components 102 mounted. Preferably components 102 are surface mountable components that may be auto-placed on circuit board 104 using techniques known in the art. Those who are of ordinary skill in the art realize that components 102 need not be surface mountable. For example, components 102 can be through-hole parts that may be manually placed on circuit board 104. However, by using a liquid adhesive 202 that is screened on the rigidizer 106 and further using surface mountable components 102, a process of assembling electronic control unit 100 may be completely automated.

As depicted in FIG. 7, circuit board 104 includes a second portion 208 that is affixed to the second portion 108 of the rigidizer 106, a bendable region 206 of the flexible circuit 104 that is located (but not bonded) adjacent to bend region 112 of the rigidizer 106, and a first portion 204 that is affixed to the first portion 101 of the rigidizer 106. The bendable region is shown divided into three sections that each overlay one of the multiple recesses 112 of the rigidizer 106, and further includes multiple cutout sections 120 that overlay each of the multiple bridges 116 of rigidizer 106. However, it should be recognized that a fewer or more bendable regions, apertures and cutouts could be provided. Grooves (shown as 30 from FIG. 3) are provided in the bending region 206 of the circuit board 104, parallel to a bending axis 103 of the assembly. It should be recognized that grooves 40 from FIG. 4, grooves 50 from FIG. 5, or other types of grooves can also be used.

Referring now to FIG. 8, an electronic control unit 100 for housing the flexible circuit board assembly is illustrated in accordance with a preferred embodiment of the present invention. FIG. 8 is a cross-sectional side view of electronic control unit 800. When the circuit board 104 and the rigidizer 106 are folded, at least a portion of each of the three sections of the bending region 206 of the circuit board 104 extend into the recesses 112, and thereby extend beyond the interior region of the rigidizer 106. By allowing the circuit board 104 to extend beyond the interior region when the circuit board 104 and rigidizer 106 are folded, recesses 112 facilitate a 'U'-shaped folding of circuit board 104. The 'U'-shaped fold results in a large radius of curvature in the bending region 206 of the circuit board 104, thereby reducing any cracking and splitting that could occur when the circuit board 104 is bent.

In practice, the rigid FR4 board will have a series of grooves routed or scored into the surface parallel to the bend axis on the side that will be in compression in the bend. Although, the present invention could be used equally well with the grooves located on an outside radius of the bend, this would result in tensile stresses on the grooves that could eventually result in stress cracking. Therefore, it is preferred that the grooves be located on an inside radius of the bend resulting in compressive forces on the grooves that are much less likely to cause stress cracking. However, the groves can be located on an outside radius or on both the inside and outside radius. In any case, the grooves will make the board flexible enough to bend through a seven millimeter radius. This can be accomplished with five V-shaped grooves with an opening at the top of about 0.33 millimeters. The beginning circuit board has a thickness of from about 0.5 to 1.0 millimeters. The depth of the grooves is such that the remaining thickness of the board at the bottom of the grooves is about 0.25 to 0.38 millimeters.

Other methods of making the rigid FR4 flexible, such as hot pressing the board in the flex area to reduce the thickness in selective areas, heating prior to bending to make the board more flexible, chemically etching to thin selective areas, chemically dissolving the FR4 material to soften the flex area, or perforating the board with small holes could also be used. Although the entire region in the bending region could be thinned, the grooves and resulting ribs formed therebetween provide a lateral stiffness that is not available with an entirely thinned region. It should also be recognized that a connector (not shown) could be mounted anywhere on the outside surface of the rigidizer to electrically connect to the circuit board through a suitable hole in the rigidizer.

Figure 9:
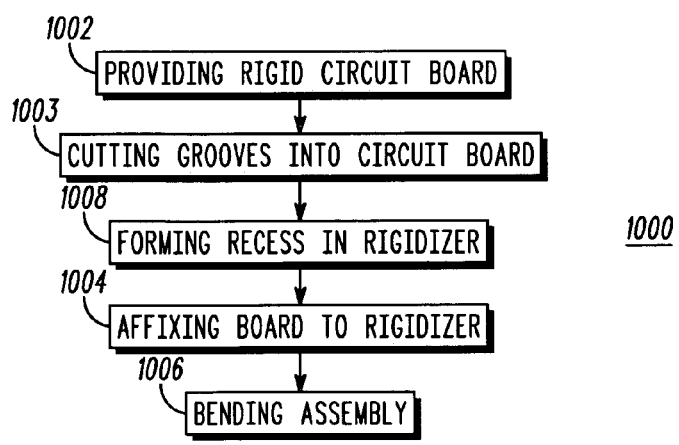
FIG. 9 is a logic flow diagram of a process of assembling a flexible circuit board assembly for an electronic control unit that includes a rigidizer and a circuit board in accordance with an embodiment of the present invention.

FIG. 9 is a logic flow diagram 1000 of a process of assembling an electronic control assembly that includes a rigidizer and a circuit board assembly in accordance with any of the embodiments of the present invention. Logic flow diagram 1000 begins by providing 1002 a substantially rigid substrate having a first portion and a second portion separated by a bendable region and a rigid circuit board having a first portion and a second portion separated by a bending region. Preferably, the providing step 1002 includes providing a multilayer circuit board composed of multiple layers of FR4 material formed with conductive traces, conductive vias, and conductive pads for securing and interconnecting electrical components thereto, and further comprising the step of solder reflowing components to the circuit board.

Logic flow continues by cutting 1003 a plurality of grooves into the bending region that are substantially parallel to an axis about which the bending region is to be bent. The cutting can be accomplished in accordance with the description above for FIGS. 3–5.

Logic flow continues by affixing 1004 the first and second portions of the circuit board to the respective first and second portions of the substrate. This can include applying an adhesive to the rigidizer and mounting the circuit board flat on the adhesive and thereby on an inner surface of the rigidizer. The circuit board and the rigidizer are then folded or bent 1006 about the bending region at the junctions of the first and second portions and the bendable region of the rigidizer. Preferably, the first and second portion of the rigidizer and circuit are bent such that the first and second portions of the circuit board and the substrate are bent at about a one hundred eighty degree angle to each other as measured from the inside surface. More preferably, the rigidizer and circuit are bent such that grooves are compressed along an inside radius of the bending region. In response to the folding of the flexible circuit board and the rigidizer, the bendable region of the folded flexible circuit board attains a 'U'-shape.

In one embodiment of the present invention, a further step includes the forming 1008 at least one recess in the bendable region of the rigidizer extending outwardly from the inner surface of the rigidizer to an outer surface thereof, and further including a plurality of bridges that interconnect the first and second portions of the rigidizer across the bendable region. In this case, the recess is sized to accept the bending region of the circuit board, such that in the bending step 1006 the bending region of the circuit board deforms into the recess of the substrate to extend beyond an interior region of the rigidizer via the recess, thereby facilitating an 'U'-shaped fold in the bending region of the flexible circuit board. Preferably, the recess has a depth of at least five millimeters extending outwardly from the inner surface of the rigidizer.

The present invention allows the replacement of flexible printed circuit boards with rigid circuits that will bend sufficiently in selective areas to allow folding into a module. It eliminates the need for soldering flex jumpers to attach two rigid circuit boards, or for processing very thin boards that need to be supported to run through the assembly process.

While the present invention has been particularly shown and described with reference to particular embodiments thereof, it will be understood by those skilled in the art that various changes may be made and equivalents substituted for elements thereof without departing from the broad scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. A flexible circuit board assembly comprising:
    a rigid circuit board having a first portion and a second portion separated by a bending region, the rigid circuit board having a plurality of layers; and
    a plurality of grooves cut into the bending region, the grooves being cut substantially parallel to an axis about which the bending region is bent, wherein the grooves are cut at least half way through the rigid circuit board.

2. The assembly of claim 1, wherein the rigid circuit board comprises a fiberglass-weave epoxy material.

3. The assembly of claim 1, wherein the grooves are disposed on an inside radius of the bending region.

4. The assembly of claim 1, wherein the grooves have a V-shaped profile.

5. The assembly of claim 1, wherein the grooves have a substantially rectangular-shaped profile.

6. The assembly of claim 1, wherein the rigid circuit board is bent at the bending region at an angle of up to one hundred eighty degrees as measured from an inside surface of the rigid circuit board.

7. The assembly of claim 1, wherein the rigid circuit board includes electrical traces disposed across the bending region.

8. A flexible circuit board assembly comprising:
    a multi-layer, rigid fiberglass-weave epoxy circuit board having a first portion and a second portion separated by a bending region; and
    a plurality of grooves cut into the bending region, the grooves being cut substantially parallel to an axis about which the bending region is bent, wherein the grooves are cut at least half way through the rigid circuit board.

9. The assembly of claim 8, wherein the grooves are cut about two-thirds of the way through the rigid circuit board.

10. The assembly of claim 8, wherein the grooves have a profile selected from one of the group of a V-shape, a U-shape, and a substantially rectangular shape.

11. The assembly of claim 8, wherein the rigid circuit board is bent at the bending region at an angle of up to one hundred eighty degrees as measured from an inside surface of the rigid circuit board, and wherein the grooves are disposed on an inside radius of the bending region.

12. The assembly of claim 8, wherein the rigid circuit board includes electrical traces disposed from the first portion to the second portion of the rigid circuit board across the bending region separating the first and second portion on one of an uncut layer in the bending region of the rigid circuit board.

13. A method for forming a flexible circuit board, the method comprising the steps of:
    providing a substantially rigid, multilayer circuit board having a first portion and a second portion separated by a bending region wherein the multilayer circuit board comprises a fiberglass-weave epoxy material;
    cutting a plurality of grooves into the bending region that are substantially parallel to an axis about which the bending region is to be bent, the grooves are cut at least half way through the rigid circuit board; and
    bending the rigid circuit board about the bending region.

14. The method of claim 13, wherein the cutting step includes milling the grooves into the substrate such that the grooves have at least one of the group of a V-shaped profile, a U-shaped profile, and a substantially rectangular shaped profile.

15. The method of claim 13, wherein the bending step includes bending the substrate such that the grooves are along an inside radius of the bending region.

16. The method of claim 13, wherein the bending step includes bending the circuit board at the bending region at an angle of up to one hundred eighty degrees as measured from an inside surface of the rigid circuit board.

17. The method of claim 13, wherein the providing step includes providing the circuit board with electrical traces disposed across the bending region.

* * * * *